United States Patent
Kumagai et al.

(10) Patent No.: US 6,562,492 B1
(45) Date of Patent: May 13, 2003

(54) LAMINATED STRUCTURE, AND MANUFACTURING METHOD THEREOF

(75) Inventors: Sho Kumagai, Kodaira (JP); Masato Yoshikawa, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/856,366

(22) PCT Filed: Dec. 2, 1999

(86) PCT No.: PCT/JP99/06777

§ 371 (c)(1),
(2), (4) Date: May 22, 2001

(87) PCT Pub. No.: WO00/37251

PCT Pub. Date: Jun. 29, 2000

(30) Foreign Application Priority Data

Dec. 22, 1998 (JP) .......................................... 10-365234
Nov. 29, 1999 (JP) .......................................... 11-337615

(51) Int. Cl.⁷ ........................... B32B 9/00; B32B 27/36; C03C 17/22
(52) U.S. Cl. ....................... 428/698; 428/336; 428/412; 428/428; 204/298.12; 204/298.13; 369/13.35
(58) Field of Search ................................. 428/426, 428, 428/698, 412, 332, 336; 204/192.15, 298.12, 298.13; 369/13.35, 288

(56) References Cited

U.S. PATENT DOCUMENTS 4,777,068 A * 10/1988 Omata et al. ................. 428/69
5,098,541 A * 3/1992 Funkenbusch ......... 204/192.15

FOREIGN PATENT DOCUMENTS

| JP | A 1-192541 | 8/1989 |
| JP | A 2-55246 | 2/1990 |
| JP | A 5-287063 | 11/1993 |
| JP | 407073527 A * | 3/1995 |
| JP | A 7-161070 | 6/1995 |
| JP | A 10-67565 | 3/1998 |
| JP | A 2000-169232 | 6/2000 |
| JP | A 2000-169233 | 6/2000 |
| JP | A 2000-169246 | 6/2000 |
| JP | A 2000-173968 | 6/2000 |

* cited by examiner

Primary Examiner—Deborah Jones
Assistant Examiner—Stephen Stein
(74) Attorney, Agent, or Firm—Oliff & Berridge, PLC

(57) ABSTRACT

A laminated structure which has a substrate formed of a synthetic resin or glass and a silicon carbide coating layer formed by sputtering, wherein the light transmittance of the silicon carbide coating layer is 80% or less. Preferably, the silicon carbide coating layer has a light reflectance of 10 to 50%, the synthetic resin is polycarbonate, the impurity ratio on the surface of the silicon carbide coating layer is $1.0 \times 10^{12}$ atoms/cm² or less, and the silicon carbide layer has a thickness of 15 to 100 nm. The laminated structure is suitable for a recording medium such as a CD-ROM and a DVD-ROM since it has a silicon carbide layer excellent in oxidation resistance, chlorine resistance, moisture resistance, and the like.

6 Claims, No Drawings

LAMINATED STRUCTURE, AND MANUFACTURING METHOD THEREOF

TECHNICAL FIELD

The present invention relates to a laminated structure and a manufacturing method thereof. Particularly, the present invention relates to a laminated structure having a coating layer suitable for an optical disk recording medium, and a method of manufacturing the laminated structure.

BACKGROUND ART

As for read-only type optical disks of which CD-ROMs and DVD-ROMs are representative, one method of increasing the recording capacity per optical disk is a method of forming a recording layer, which includes signal information, as a two-layer structure. In a method in which a laser is irradiated from one side of an optical disk and what is recorded in the disk is thereby read in the same direction, of two layers, the layer closer to the side on which the laser is irradiated needs to be a semipermeable recording layer having some degree of light transmittance and light reflectance. Conventionally, this semipermeable recording layer is obtained by using gold or silver as a target material in a sputtering method and depositing it onto a substrate having convex and concave pits. The semipermeable recording layer formed of gold or silver has a light transmittance and a light reflectance necessary for the optical disk.

However, the semipermeable recording layer of this type has a disadvantage in terms of manufacturing cost since gold or silver is expensive, and a problem of difficult handling arises because the specific gravity of the semipermeable recording layer is large. Therefore, as a material for the semipermeable recording layer of the optical disk, there has been a demand for a material to replace gold or silver. Moreover, in the case of the semipermeable recording layer, since a thin layer of pure gold or silver is formed during sputtering, there is no way but to control the thickness of the semipermeable recording layer in order to obtain light reflectance and the like necessary for the semipermeable recording layer, and a problem arises that the semipermeable recording layer is not easily formed.

In general, sputtering is used to form the semipermeable recording layer. One of the reasons why sputtering is used is that, in order to lower the formation cost, physical methods such as sputtering, ion plating, vacuum deposition, and the like are advantageous over chemical methods of which a CVD method is representative, and among these physical methods, sputtering enables high-speed formation of the semipermeable recording layer and excellent adhesion of the semipermeable recording layer with respect to the substrate. In the case of using the DC power system by which the semipermeable recording layer can be formed at high speed, the target material used for sputtering needs to have such an electric conductivity that the volume resistivity is $10^0$ $\Omega \cdot cm$ or less, and preferably about $10^2$ $\Omega \cdot cm$ or less.

An object of the present invention is to overcome the conventional problems described above, that is, to provide a laminated structure having a silicon carbide coating layer which has excellent oxidation resistance, chlorine resistance, moisture resistance, and the like, and is therefore suitable for an optical disk recording medium such as a CD-ROM, a DVD-ROM, and the like, in particular, and to provide a method of manufacturing a laminated structure in which the aforementioned laminated structure can be simply and reliably manufactured.

DISCLOSURE OF THE INVENTION

As a result of their thorough investigations for the purpose of achieving the above object, the present inventors have learned the following. As a result of seeking a substitute material for gold or silver as a target material used in the sputtering method, they have found that metals other than gold or silver are difficult to handle because many of them have a large specific gravity in general. Further, since a thin layer of a pure metal is formed by sputtering, the only way to obtain the light reflectance and the like necessary for a semipermeable recording layer is to control the thickness of the semipermeable recording layer, and manufacture thereof is thus not easy. On the other hand, many ceramic materials are generally insulating materials, and their use as target materials is difficult. However, a sintered silicon carbide used in the present invention has a volume resistivity of $10^0$ $\Omega \cdot cm$ or less, and therefore is effective as a target material which can control, by sputtering conditions, the optical characteristics of the semipermeable recording layer formed in a thin shape.

Further, as the target material which can control the optical characteristics of the semipermeable recording layer by sputtering conditions, a sintered silicon carbide of high density and high purity having a volume resistivity of $10^0$ $\Omega \cdot cm$ or less is further effective. The sintered silicon carbide is obtained by carrying out, in a process for producing a sintered silicon carbide disclosed in Japanese Patent Application Laid-Open (JP-A) No. 10-67565 proposed by the present inventors, a step of introducing a nitrogen-containing compound at the time of preparing a mixture of a silicon carbide powder and a non-metallic sintering assisting material, or a step of introducing a nitrogen-containing compound during preparation of a silicon carbide powder at the time of mixing a carbon source and a silicon source, which are the raw materials of the silicon carbide powder. Furthermore, a sintered silicon carbide of high density and high purity, having an impurity ratio of less than $1.0 \times 10^{11}$ atoms/cm$^2$ on or near the surface, and having a volume resistivity of $10^0$ $\Omega \cdot cm$ or less, is further effective. This impurity ratio on or near the surface is obtained by cleaning processes disclosed in Japanese Patent Application Nos. 10-348569 and 10-348701 proposed by the present inventors.

Based on the above-described knowledge obtained by the present inventors, the present invention includes the following aspects.

<1> A laminated structure which has a substrate formed of a synthetic resin or glass and a silicon carbide coating layer formed on the substrate by sputtering in which a sintered silicon carbide having a volume resistivity of $10^0$ $\Omega \cdot cm$ or less is used as a target material, wherein the silicon carbide coating layer has a light transmittance of 80% or less and a volume resistivity of $10^0$ $\Omega \cdot cm$ or less.

<2> A laminated structure according to <1>, wherein the silicon carbide coating layer has a light reflectance of 10 to 50%.

<3> A laminated structure according to <1> or <2>, wherein the synthetic resin is polycarbonate.

<4> A laminated structure according to any of <1> to <3>, wherein the impurity ratio on the surface of the silicon carbide coating layer is $1.0 \times 10^{12}$ atoms/cm$^2$ or less.

<5> A laminated structure according to any of <1> to <4>, wherein the thickness of the silicon carbide coating layer is 15 to 100 nm.

<6> A method of manufacturing a laminated structure having a substrate formed of a synthetic resin or glass and a silicon carbide coating layer formed on the substrate by sputtering in which a sintered silicon carbide having a volume resistivity of $10^0$ Ω·cm or less is used as a target material, wherein the silicon carbide coating layer is formed by controlling electric power inputted to a sputtering device, flow rate of oxygen gas or nitrogen gas introduced, and sputtering time.

<7> A method of manufacturing a laminated structure according to <6>, wherein the target material is a sintered silicon carbide, and the sintered silicon carbide has an impurity ratio of $1.0 \times 10^{12}$ atoms/cm$^2$ or less on and near the surface thereof, and a density of 2.9 g/cm$^3$ or more.

<8> A laminated structure according to any of <1> to <5>, wherein the density of the silicon carbide coating layer is 2.9 g/cm$^3$ or more.

<9> A laminated structure according to any of <1> to <5> and <8>, used as an optical disk recording medium.

PREFERRED EMBODIMENT FOR IMPLEMENTING THE INVENTION

Hereinafter, a laminated structure and a manufacturing method thereof according to the present invention will be described in detail.

The laminated structure according to the present invention has a substrate and a silicon carbide coating layer on the substrate. The light transmittance of the silicon carbide coating layer is 80% or less.

The substrate is formed of a synthetic resin or glass.

Examples of the synthetic resin include polycarbonate, polymethyl methacrylate, polyolefine, and the like. Examples of the polyolefine include polyethylene, polypropylene, polybutene, and the like.

In the present invention, when used as a substrate material for DVDs or the like, polycarbonate is particularly preferable among these materials in terms of refractive index, light transmittance, thermal deformation temperature, thermal conductivity, saturated water absorption, and the like.

The silicon carbide coating layer is preferably formed by sputtering with a sintered silicon carbide used as the target material.

The light transmittance of the silicon carbide coating layer is 80% or less, preferably 75% or less, and more preferably 70% or less.

The light transmittance is calculated as follows. For a complex in which a silicon carbide coating layer having a thickness of 100 nm is formed on a glass substrate having a thickness of 1 mm, a light transmittance spectrum is measured using a spectrum photometer (manufactured by Hitachi, Ltd., U-4000) while the wavelength of incident light is changed from 250 nm to 1000 nm. Subsequently, for a complex in which a 100 nm thick silicon carbide coating layer is formed on a 1 mm thick glass substrate which has been processed so that light does not reflect on the rear surface, a light reflectance spectrum is measured using the spectrum photometer while the wavelength of incident light is changed from 250 nm to 1000 nm. From the light transmittance spectrum and the light reflectance spectrum, a spectrum of a real number part of refractive indices and a spectrum of an imaginary number part of the refractive indices are calculated by a refractive index analyzer (manufactured by n & k Technology Co., Ltd., Iris 200). Then, by substituting the calculated spectrum of the real number part of the refractive indices and spectrum of the imaginary number part of the refractive indices at a wavelength of 633 nm of the incident light into the following equation, the light transmittance (%) of the silicon carbide coating layer of any thickness is obtained. The light transmittance described above refers to this light transmittance (%). The following equation takes into consideration an interference effect of repeated reflectance within a parallel plane layer.

Light transmittance $$T\ (\%) = \frac{e^{-\alpha d}\{(1-r)^2 + 4r\sin^2\phi\}}{\{(1-re^{-\alpha d})^2 + 4re^{-\alpha d}\sin^2(\phi+\beta)\}} \times 100$$

$\alpha = 4\pi\kappa/\lambda$ $\beta = 2\pi n\ d/\lambda$ $r = \{(n-1)^2 + \kappa^2\}/\{(n+1)^2 + \kappa^2\}$ $\tan\phi = 2\kappa/(n^2 + \kappa^2 + 1)$ $\kappa = k/n$ In the above equation, λ represents the wavelength of the incident light (i.e., 633 nm), n represents the real number part of the refractive indices, k represents the imaginary number part of the refractive indices, and d represents the thickness of the silicon carbide coating layer.

When the light transmittance exceeds 80%, the amount of light reflected from the semipermeable recording layer decreases, and thus it becomes difficult to read information recorded on the semipermeable recording layer. This is not preferable since the rate of occurrence of errors increases.

A laminated structure having a silicon carbide coating layer with a light transmittance of 80% or less is preferable as a semipermeable recording layer at which signal pits are formed in read-only type optical disks such as DVD-ROMs, DVD-VIDEOs, DVD-AUDIOs, and the like.

The light reflectance of the silicon carbide coating layer is preferably 10 to 50%, more preferably 20 to 40%, and particularly preferably 30 to 40%.

The light reflectance is calculated as follows. For a complex in which a silicon carbide coating layer having a thickness of 100 nm is formed on a glass substrate having a thickness of 1 mm, a light transmittance spectrum is measured using the spectrum photometer (manufactured by Hitachi Ltd., U-4000) while the wavelength of incident light is changed from 250 nm to 1000 nm. Next, for a complex in which a 100 nm thick silicon carbide coating layer is formed on a 1 mm thick glass substrate which has been processed so that light does not reflect on the rear surface, a light reflectance spectrum is measured using the spectrum photometer while the wavelength of incident light is changed from 250 nm to 1000 nm. From the light transmittance spectrum and the light reflectance spectrum, a spectrum of a real number part of refractive indices and a spectrum of an imaginary number part of the refractive indices are calculated by the refractive index analyzer (manufactured by n & k Technology Co., Ltd., Iris 200). Then, by substituting the calculated spectrum of the real number part of the refractive indices and spectrum of the imaginary number part of the refractive indices at a wavelength of 633 nm of the incident light into the following equation, the light reflectance (%) of the silicon carbide coating layer of any thickness is obtained. The light reflectance described above refers to this light reflectance (%). The following equation takes into consideration an interference effect of repeated reflectance within a parallel plane layer.

Light reflectance $$R\ (\%) = \frac{r\{(1-e^{-\alpha d})^2 + 4e^{-\alpha d}\sin^2\beta\}}{\{(1-re^{-\alpha d})^2 + 4re^{-\alpha d}\sin^2(\phi+\beta)\}} \times 100$$

$\alpha = 4\pi\kappa/\lambda$
$\beta = 2\pi n\ d/\lambda$
$r = \{(n-1)^2 + \kappa^2\}/\{(n+1)^2 + \kappa^2\}$
$\tan \phi = 2\pi/(n^2 + \kappa^2 + 1)$
$\kappa = k/n$ In the above equation, λ, n, k, and d are the same as described above.

If the light reflectance is less than 10%, the amount of light reflected from the semipermeable recording layer decreases, and thus it becomes difficult to read information recorded on the semipermeable recording layer, and the rate of occurrence of errors may increase. If the light reflectance exceeds 50%, on the other hand, the amount of light reflected from a total reflection recording layer, which is far from the side on which a laser is irradiated, decreases. As a result, it becomes difficult to read information recorded on the total reflection recording layer, and the rate of occurrence of errors may increase.

The impurity ratio on the surface of the silicon carbide coating layer is preferably $1.0 \times 10^{12}$ atoms/cm$^2$ or less.

If the ratio exceeds $1.0 \times 10^{12}$ atoms/cm$^2$, defects may be easily caused on pits at the time of forming a disk, thereby increasing the rate of occurrence of errors.

The thickness of the silicon carbide coating layer is preferably 15 to 100 nm.

If the thickness of the silicon carbide coating layer is less than 15 nm, the light transmittance becomes large. If the thickness of the silicon carbide coating layer exceeds 100 nm, on the other hand, time required for forming the silicon carbide coating layer becomes significantly long. Therefore, neither case is preferable.

The laminated structure of the present invention can be preferably manufactured by the method of manufacturing a laminated structure according to the present invention. This method will be described hereinafter.

The method of manufacturing a laminated structure of the present invention is characterized in that a target material is used to form the silicon carbide coating layer of the laminated structure of the present invention on the substrate by sputtering, and that electric power inputted to a sputtering device, the flow rate of oxygen gas or nitrogen gas introduced into the sputtering device, and sputtering time are controlled during the formation of the silicon carbide coating layer.

Sputtering methods depend on the conductivity of the target material used. When the target material has low conductivity, high frequency sputtering, high frequency magnetron sputtering, or the like is used. When the target material has high conductivity, DC sputtering, DC magnetron sputtering, or the like is used.

Among these sputtering methods, when a sintered silicon carbide is used as the target material, DC sputtering or DC magnetron sputtering is preferable since the target material is conductive.

In the case of DC sputtering which can form a coating layer at high speed, the target material preferably has a volume resistivity of $10^0$ Ω·cm or less and needs to have a conductivity of about $10^{-2}$ Ω·cm or less.

As for the sintered silicon carbide used as the target material, a sintered silicon carbide of high density and high purity having a volume resistivity of $10^0$ Ω·cm or less is preferable. Such a sintered silicon carbide can be obtained by carrying out, in the process for producing a sintered silicon carbide disclosed in JP-A No. 10-67565 proposed by the present inventors, a step of introducing a nitrogen-containing compound during preparation of a mixture of a silicon carbide powder and a non-metallic sintering assisting material, or a step of introducing a nitrogen-containing compound during preparation of a silicon carbide powder at the time of mixing a carbon source and a silicon source, which are the raw materials of the silicon carbide powder. More preferable is a sintered silicon carbide of high density and high purity, having an impurity ratio of less than $1.0 \times 10^{11}$ atoms/cm$^2$ on or near the surface, and having a volume resistivity of $10^0$ Ω·cm or less. This impurity ratio on or near the surface is obtained by cleaning processes disclosed in Japanese Patent Application Nos. 10-348570 and 10-348700 proposed by the present inventors.

A method of carrying out sputtering by using the sintered silicon carbide as the target material will be described hereinafter.

Sputtering can be carried out in an atmosphere of inert gas such as argon and at an atmosphere pressure of $1.0 \times 10^{-1}$ to $1.0 \times 10^0$ Pa after introducing inert gas.

Unlike gold or silver, the optical characteristics, such as the light transmittance, the light reflectance, and the like, of the silicon carbide coating layer of the laminated structure of the present invention, which is manufactured by the method of manufacturing a laminated structure according to the present invention, can be controlled by electric power inputted during sputtering, flow rate of oxygen gas or nitrogen gas introduced (the introduction flow rate may be zero, that is, there may be no introduction), and sputtering time (that is, the thickness of the silicon carbide coating layer to be formed).

Electric power inputted during sputtering depends on the area of the target material. The density of electric power inputted to the target material is represented by "electric power inputted/area of target material". However, if the density of electric power inputted is too large, failure of the target material may be caused. Therefore, the density of electric power inputted is preferably 1.25 to 15.0 W/cm$^2$.

An example of the present invention will be described below. However, the present invention is not limited to this example.

Production of Target Material

The target material used herein is a sintered silicon carbide obtained by the method described in Example 1 of Japanese Patent Application No. 10-348700. The sintered silicon carbide has a density of 3.13 g/cm$^3$, an impurity ratio of less than $1.0 \times 10^{11}$ atoms/cm$^2$ on or near the surface, and a volume resistivity of $3.2 \times 10^{-2}$ Ω·cm.

Sputtering Method

The target material having a thickness of φ100 mm×5 mm was loaded in a sputtering device (SH-250, manufactured by ULVAC Japan, Ltd.). After the ultimate vacuum within the sputtering device was adjusted to $7 \times 10^{-5}$ Pa, argon gas was supplied into the sputtering device at a flow rate of 10 cm$^3$/minute. Sputtering time was adjusted so that the thickness of respective silicon carbide coating layers was set to values given in the following Tables 1 and 2. Laminated structures, each of which has a silicon carbide coating layer formed a glass substrate having dimensions of 5 cm×5 cm×1 cm and washed with a cleaning solution (produced by Tama Chemicals Co., Ltd., TMSC), were produced.

The silicon carbide coating layers thus formed were respectively measured by a coating thickness measuring profilometer (manufactured by Rank Taylor-Hobson Co., Ltd., Talystep), and it was confirmed that they each had a desired thickness.

atmosphere pressure before introduction of inert gas into the sputtering device was $7 \times 10^{-5}$ Pa. The results are given in Tables 1 and 2.

TABLE 1

| Electric power | Flow rate of $O_2$ | Flow rate of $N_2$ | Thickness of coating layers (nm) | | | | | Weight changes in oxidation | Weight changes in chlorine | Moisture |
|---|---|---|---|---|---|---|---|---|---|---|
| (W) | (cm³/min) | (cm³/min) | 15 | 40 | 60 | 75 | 100 | resistance test (%) | resistance test (%) | resistance test |
| 1000 | 0.0 | 0.0 | 62.5 | 30.0 | 32.5 | 49.5 | 72.8 | 0 | 0 | No change |
| 500 | 0.0 | 0.0 | 62.5 | 30.0 | 32.4 | 49.1 | 71.9 | 0 | 0 | No change |
| 100 | 0.0 | 0.0 | 63.2 | 30.5 | 32.5 | 48.4 | 73.0 | 0 | 0 | No change |
| 500 | 0.5 | 0.0 | 68.2 | 34.1 | 33.8 | 46.1 | 81.1 | 0 | 0 | No change |
| 500 | 1.0 | 0.0 | 77.8 | 43.5 | 38.7 | 44.8 | 76.0 | 0 | 0 | No change |
| 500 | 1.5 | 0.0 | 87.9 | 59.5 | 50.0 | 50.1 | 63.7 | 0 | 0 | No change |
| 500 | 2.0 | 0.0 | 93.9 | 75.1 | 64.6 | 61.4 | 64.8 | 0 | 0 | No change |
| 500 | 0.0 | 0.5 | 73.6 | 38.9 | 36.1 | 44.9 | 81.3 | 0 | 0 | No change |
| 500 | 0.0 | 1.0 | 79.3 | 45.3 | 39.8 | 45.1 | 74.5 | 0 | 0 | No change |
| 500 | 0.0 | 1.5 | 83.2 | 50.7 | 43.4 | 46.5 | 69.2 | 0 | 0 | No change |
| 500 | 0.0 | 2.0 | 85.0 | 53.8 | 45.5 | 47.5 | 66.7 | 0 | 0 | No change |
| 1000 | 0.0 | 1.0 | 74.5 | 39.8 | 36.6 | 45.0 | 81.3 | 0 | 0 | No change |
| 100 | 0.0 | 1.0 | 85.8 | 55.4 | 46.7 | 48.0 | 65.0 | 0 | 0 | No change |
| 1000 | 0.0 | 2.0 | 80.7 | 47.1 | 40.9 | 45.4 | 72.4 | 0 | 0 | No change |
| 100 | 0.0 | 2.0 | 88.7 | 61.4 | 51.5 | 51.1 | 62.6 | 0 | 0 | No change |
| | | | Transmittance (%) (incident light having a wavelength of 633 nm) | | | | | | | |

TABLE 2

| Electric power | Flow rate of $O_2$ | Flow rate of $N_2$ | Thickness of coating layers (nm) | | | | | Weight changes in oxidation | Weight changes in chlorine | Moisture |
|---|---|---|---|---|---|---|---|---|---|---|
| (W) | (cm³/min) | (cm³/min) | 15 | 40 | 60 | 75 | 100 | resistance test (%) | resistance test (%) | resistance test |
| 1000 | 0.0 | 0.0 | 33.6 | 66.5 | 63.1 | 41.9 | 7.0 | 0 | 0 | No change |
| 500 | 0.0 | 0.0 | 33.4 | 66.2 | 62.9 | 41.9 | 6.7 | 0 | 0 | No change |
| 100 | 0.0 | 0.0 | 32.7 | 65.6 | 62.7 | 42.6 | 5.2 | 0 | 0 | No change |
| 500 | 0.5 | 0.0 | 28.3 | 62.4 | 62.1 | 47.2 | 0.6 | 0 | 0 | No change |
| 500 | 1.0 | 0.0 | 19.6 | 53.4 | 58.0 | 50.9 | 13.5 | 0 | 0 | No change |
| 500 | 1.5 | 0.0 | 10.2 | 37.5 | 46.8 | 46.2 | 30.4 | 0 | 0 | No change |
| 500 | 2.0 | 0.0 | 4.8 | 22.4 | 32.5 | 35.4 | 31.0 | 0 | 0 | No change |
| 500 | 0.0 | 0.5 | 23.5 | 58.0 | 60.5 | 50.2 | 5.4 | 0 | 0 | No change |
| 500 | 0.0 | 1.0 | 18.3 | 51.8 | 57.2 | 50.9 | 16.3 | 0 | 0 | No change |
| 500 | 0.0 | 1.5 | 14.8 | 46.5 | 53.7 | 50.0 | 23.7 | 0 | 0 | No change |
| 500 | 0.0 | 2.0 | 13.0 | 43.4 | 51.5 | 48.9 | 26.7 | 0 | 0 | No change |
| 1000 | 0.0 | 1.0 | 22.9 | 57.3 | 60.2 | 50.5 | 6.7 | 0 | 0 | No change |
| 100 | 0.0 | 1.0 | 12.0 | 41.4 | 49.9 | 48.0 | 27.9 | 0 | 0 | No change |
| 1000 | 0.0 | 2.0 | 17.0 | 50.0 | 56.0 | 50.7 | 19.1 | 0 | 0 | No change |
| 100 | 0.0 | 2.0 | 9.2 | 35.1 | 44.7 | 44.8 | 30.9 | 0 | 0 | No change |
| | | | Reflectance (%) (incident light having a wavelength of 633 nm) | | | | | | | |

Evaluation Method

Oxidation resistance: The laminated structures were kept in an oxygen atmosphere at 50° C. for 1000 hours, and changes in the weights of the respective silicon carbide coating layers were measured.

Chlorine resistance: The laminated structures were kept in a chlorine atmosphere at 50° C. for 1000 hours, and changes in the weights of the respective silicon carbide coating layers were measured.

Moisture resistance: A silicon carbide coating layer was formed on an iron substrate, and this structure was kept in an atmosphere of a humidity of 70% at 50° C. for 1000 hours. Changes in the iron substrate were observed by a light microscope with a magnification of ×1000.

The electric power inputted to the sputtering device, the flow rate of oxygen gas and/or nitrogen gas introduced, and the sputtering time were changed as shown in Tables 1 and 2, and silicon carbide coating layers were respectively formed on glass substrates by sputtering. The ultimate Table 1 shows the light transmittance data, and Table 2 shows the light reflectance data, of the silicon carbide coating layers in the laminated structures respectively manufactured, and the respective columns in Tables 1 and 2 correspond to each other. In Table 1, the laminated structures whose light transmittance values given in the column "Thickness of coating layers" exceed 80% correspond to Comparative Examples, while the laminated structures whose light transmittance values given in the column are less than 80% correspond to Examples.

INDUSTRIAL APPLICABILITY

In accordance with the present invention, the conventional problems described above can be solved. Further, there can be provided a laminated structure, which has a silicon carbide coating layer excellent in oxidation resistance, chlorine resistance, moisture resistance, and the like, and is therefore suitable for an optical disk recording medium such as a CD-ROM, a DVD-ROM, and the like, and a method of manufacturing a laminated structure which enables simple and reliable manufacture of the laminated structure.

What is claimed is:

1. A laminated structure comprising a substrate formed of a synthetic resin or glass and a silicon carbide coating layer formed on the substrate by sputtering, wherein a sintered silicon carbide, the impurity ratio on or near the surface of the sintered silicon carbide being $1.0 \times 10^{11}$ atoms/cm$^2$ or less, and having a high density, a high purity and a volume resistivity of $10^0$ Ω·cm or less is used as a target material, wherein the silicon carbide coating layer has a light transmittance of 80% or less and a volume resistivity of $10^0$ Ω·cm or less and an impurity ratio of $1.0 \times 10^{11}$ atoms/cm$^2$ or less.

2. A laminated structure according to claim 1, wherein the silicon carbide coating layer has a light reflectance of 10 to 50%.

3. A laminated structure according to claim 1, wherein the synthetic resin is polycarbonate.

4. A laminated structure according to claim 1, wherein the thickness of the silicon carbide coating layer is 15 to 100 nm.

5. A laminated structure according to claim 1, wherein the density of the silicon carbide coating layer is 2.9 g/cm$^3$ or more.

6. A laminated structure according to claim 1, used as an optical disk recording medium.

* * * * *